US012770843B2

(12) United States Patent
Pei et al.

(10) Patent No.: US 12,770,843 B2
(45) Date of Patent: Oct. 20, 2026

(54) MECHANISM FOR FILTERING ETCHING BYPRODUCT DURING SEMICONDUCTOR FABRICATION AND METHOD THEREOF

(71) Applicant: TAIWAN SEMICONDUCTOR MANUFACTURING COMPANY LTD., Hsinchu (TW)

(72) Inventors: Ming-Ying Pei, Hsinchu City (TW); Yan-Hong Liu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 399 days.

(21) Appl. No.: 18/451,140

(22) Filed: Aug. 17, 2023

(65) Prior Publication Data

US 2025/0062105 A1 Feb. 20, 2025

(51) Int. Cl.
*H01J 37/32* (2006.01)
*B01D 53/04* (2006.01)
(Continued)

(52) U.S. Cl.
CPC .... *H01J 37/32844* (2013.01); *B01D 53/0438* (2013.01); *B03C 3/08* (2013.01);
(Continued)

(58) Field of Classification Search
CPC ........ H01J 37/32844; H01J 2237/3341; B01D 53/0438; B01D 2253/102; B01D 2253/1124; B01D 2253/202; B01D 2258/0216; B03C 3/08; B03C 3/12; B03C 3/47; B03C 2201/32; H01L 21/3065; H01L 21/311; H01L 21/32135
See application file for complete search history.

(56) References Cited

U.S. PATENT DOCUMENTS 7,356,378 B1 * 4/2008 Huang ................ G06Q 10/047 700/228
2013/0230375 A1 * 9/2013 Tung ................ H01L 21/67733 414/592
(Continued)

FOREIGN PATENT DOCUMENTS

CN 113993610 A * 1/2022 ........... B01D 5/0003
DE 102022130723 A1 * 6/2023 ......... C23C 16/4412
(Continued)

*Primary Examiner* — Jeffrie R Lund
(74) *Attorney, Agent, or Firm* — WPAT LAW; Anthony King

(57) ABSTRACT

The present disclosure provides a mechanism for filtering an etching byproduct during semiconductor fabrication. The mechanism includes: an etching tool, configured to etch a portion of a material layer and having an outlet for discharging the etching byproduct formed from the etched portion of the material layer; a pipeline, for allowing the etching byproduct to flow through, the pipeline having a first end connected to the outlet of the etching tool and a second end distal to the first end and the etching tool; and a filter, disposed between the first end and the second end and configured to filter the etching byproduct. The filter includes a solidifier configured to solidify the etching byproduct by freezing or heating, and a medium configured to retain the etching byproduct solidified by the solidifier.

20 Claims, 11 Drawing Sheets

(51) Int. Cl.

| | |
|---|---|
| ***B03C 3/08*** | (2006.01) |
| ***B03C 3/12*** | (2006.01) |
| ***B03C 3/47*** | (2006.01) |
| *H10P 50/24* | (2026.01) |
| *H10P 50/26* | (2026.01) |
| *H10P 50/28* | (2026.01) |

(52) U.S. Cl.

CPC .................. *B03C 3/12* (2013.01); *B03C 3/47* (2013.01); *B01D 2253/102* (2013.01); *B01D 2253/1124* (2013.01); *B01D 2253/202* (2013.01); *B01D 2258/0216* (2013.01); *B03C 2201/32* (2013.01); *H01J 2237/3341* (2013.01); *H10P 50/242* (2026.01); *H10P 50/266* (2026.01); *H10P 50/28* (2026.01)

(56) References Cited

U.S. PATENT DOCUMENTS

| | | | | |
|---|---|---|---|---|
| 2014/0238107 | A1* | 8/2014 | Chou | G01N 1/26 73/23.36 |
| 2021/0394116 | A1* | 12/2021 | Mast | G06F 21/62 |
| 2025/0062105 | A1* | 2/2025 | Pei | B01D 53/0438 |
| 2025/0256255 | A1* | 8/2025 | Di Carlo | C01B 3/02 |

FOREIGN PATENT DOCUMENTS

| | | | | | |
|---|---|---|---|---|---|
| DE | 102022130724 | A1 | * | 6/2023 | B01D 46/0005 |
| EP | 4382188 | A1 | * | 6/2024 | B01D 50/20 |
| FR | 2933313 | A1 | * | 1/2010 | B01D 53/265 |
| JP | 2005506898 | A | * | 3/2005 | B01J 20/28004 |
| KR | 20200125276 | A | * | 11/2020 | B01D 46/448 |
| WO | WO-0185308 | A2 | * | 11/2001 | B01D 53/04 |

* cited by examiner

MECHANISM FOR FILTERING ETCHING BYPRODUCT DURING SEMICONDUCTOR FABRICATION AND METHOD THEREOF

BACKGROUND

In advanced semiconductor technologies, an etching process is one of significant processes in semiconductor manufacturing. A semiconductor structure may undergo multiple etching processes before it is complete.

However, during an etching process, etching byproducts are produced and subsequently discharged from an etching tool. Therefore, there is a need to deal with the etching byproducts and improve the etching process.

BRIEF DESCRIPTION OF THE DRAWINGS

Aspects of embodiments of the present disclosure are best understood from the following detailed description when read with the accompanying figures. It should be noted that, in accordance with standard practice in the industry, various structures are not drawn to scale. In fact, dimensions of the various structures can be arbitrarily increased or reduced for clarity of discussion.

DETAILED DESCRIPTION

Figure 1:
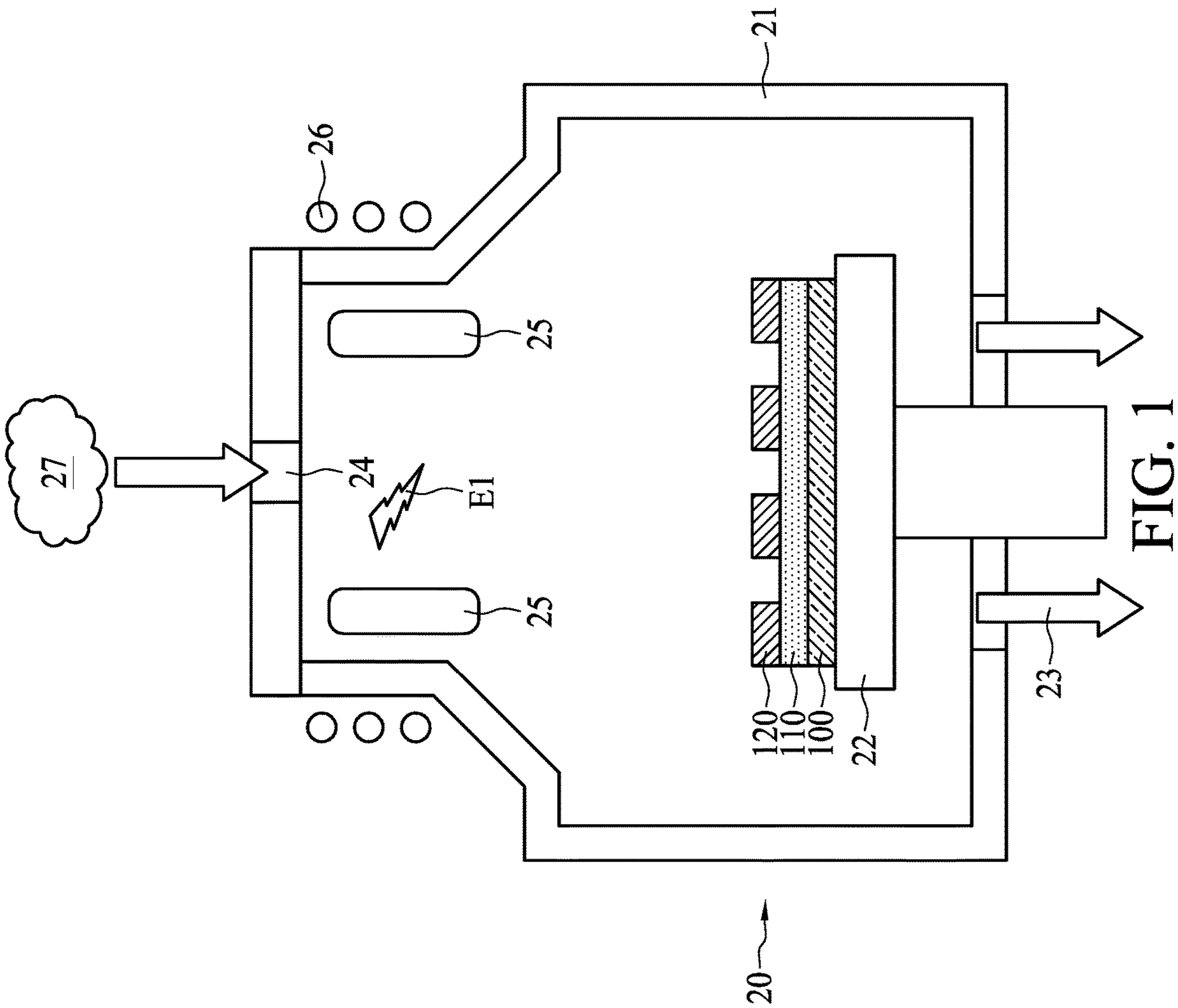
FIGS. 1 to 3 are schematic views of microscopic processes that occur during dry etching, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features can be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. Such terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the normal deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all numerical ranges, amounts, values and percentages, such as those for quantities of materials, durations of time, temperatures, operating conditions, ratios of amounts, and the likes thereof disclosed herein, should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An etching process may be classified based on the phase of etching reagents (etchants). Gas, plasma and liquid are most common etching phases. Basically, an etching process can be categorized as either dry etching or wet etching according to the etching reagents used therein.

Figure 2:
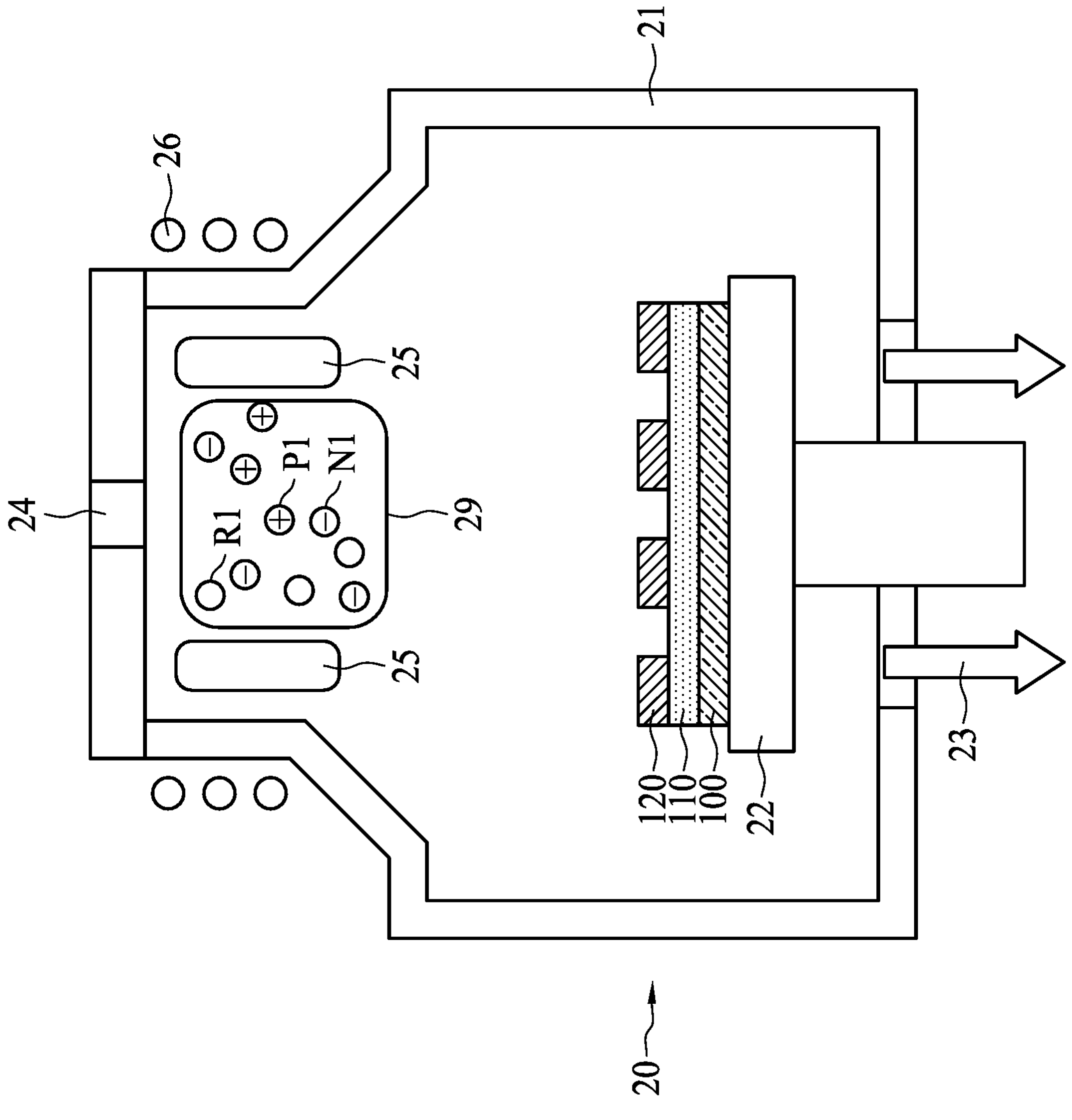
Figure 3:
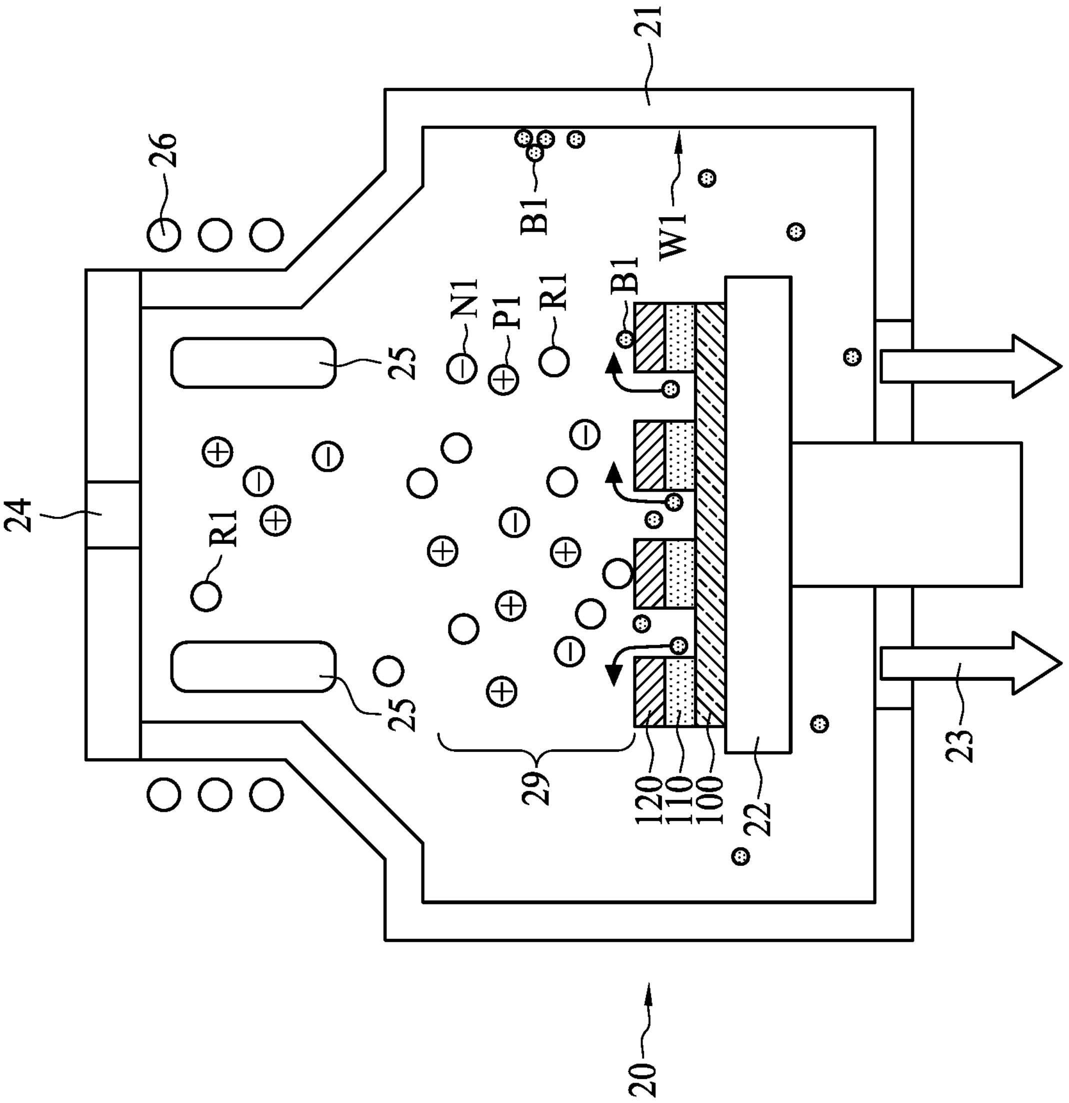

The present disclosure provides a mechanism for filtering an etching byproduct during semiconductor fabrication. FIGS. 1 to 3 are schematic views of microscopic processes that occur during dry etching. Dry etching, also referred to as plasma etching, is a process of removing portions of a semiconductor material by bombarding it with ions. The ions may form a plasma of reactive gases, such as oxygen, boron, fluorocarbons, chlorine, and trichloride. A dry etching operation may proceed with the same etching rate in all directions (isotropy) or with different etching rates in different directions (anisotropy).

FIG. 1 shows an etching tool 20 which is a type of reactive ion etching (RIE) equipment. RIE is a type of dry etching which has characteristics different from those of wet etching. Simply put, RIE uses chemically reactive plasma to remove materials formed on a wafer, while wet etching uses chemical solutions to remove materials. In RIE, the etching characteristics (etch profile, etch rate, selectivity, uniformity and reproducibility) may be precisely adjusted. Both anisotropic and isotropic etch profiles are possible.

The etching tool 20 may at least include an etching chamber 21, a chuck 22, a pump system 23, an etchant inlet 24, a pair of electrodes 25 and a power supply 26. The etching chamber 21 may be a cylindrical vacuum chamber with the chuck 22 situated in a bottom portion of the etching chamber 21. The chuck 22 is designed to keep a substrate 100 at a near-ambient temperature during an etching operation. The pump system 23 pumps continuously to maintain a low pressure in the etching chamber 21. Gas pressure in the etching chamber 21 is typically in a range between a few millitorr and a few hundred millitorr. An etchant 27 may be injected into the etching chamber 21 through the etchant inlet 24 and may exit via the pump system 23 at the bottom portion of the etching chamber 21. The etchant 27 may be reactive to a material layer 110 formed on the substrate 100. In some embodiments, the etchant 27 is in a gaseous or fluid state.

The pair of electrodes 25 and the power supply 26 function to generate reactive species. A strong radio frequency (RF) electric field E1 may be generated between the pair of electrodes 25. In some embodiments, the electric field E1 is applied at a few hundred watts (W) and set to a frequency between about 10 megahertz (MHz) and about 15 MHz. The pair of electrodes 25 may be energized by the power supply 26. The power supply 26 may include multiple coils.

The substrate 100 with the material layer 110 formed thereon is placed in the etching tool 20. The substrate 100 may be a wafer, and the material layer 110 may include a dielectric layer, a metallic layer, a semiconductor layer, a ceramic layer, a glass layer or the like. Prior to the etching operation, a mask layer 120 may be formed on the material layer 110. The mask layer 120 may be a photoresist layer or a hard mask layer which has been patterned using a photolithographic method. Therefore, the mask layer 120 may include a predetermined pattern such as strips or holes that expose portions of the material layer 110.

Referring to FIG. 2, shortly after the etchant 27 enters the etching chamber 21, some of the etchant 27 is ionized by the electric field E1 and reduced into electrons, ions and free radicals, thus creating a plasma 29. The plasma 29 may include several reactive species such as high-energy electrons, positive ions (cations) P1, negative ions (anions) N1, free radicals R1, and undissociated or neutral gaseous molecules and their fragments. Three types of collisions may occur in the plasma 29 to stabilize it. First, high-energy electrons may collide with neutral gaseous molecules to form ionized reactive species. Second, excitation and relaxation processes occur continuously in the plasma 29 and cause the plasma 29 to grow. Third, the undissociated gaseous molecules of the etchant 27 are dissociated to form more free radicals R1.

Referring to FIG. 3, the reactive species of the plasma 29 are accelerated up and down in the chamber. The positive ions P1, the negative ions N1 and the free radicals R1 may diffuse toward the substrate 100. The plasma 29 may collide with portions of the material layer 110 which are not protected by the mask layer 120. The reactive species of the plasma 29 may react physically and chemically with the material layer 110 and knock off portions of the material layer 110 by transferring some of the reactive species' kinetic energy. That is, portions of the material layer 110 are etched by the etching tool 20. The reacted and/or knocked-off portions of the material layer 110 form etching byproducts B1. In the etching operation, the reactive species specifically react with the material layer 110 to cause the material layer 110 to be etched at a higher rate than other materials such as the mask layer 120 and the substrate 100.

The etching byproducts B1 may be gas molecules or free radicals. In some embodiments, the etching byproducts B1 include tetrafluoromethane ($CF_4$), fluoroform ($CHF_3$), hexafluorocyclobutene ($C_4F_6$), hexafluoro-1,3-butadiene ($C_4F_6$), sulfur hexafluoride ($SF_6$), carbon monoxide (CO), octafluorocyclobutane ($C_4F_8$), hexafluoroethane ($C_2F_6$), chlorine ($Cl_2$), boron trichloride ($BCl_3$), aluminum chloride ($AlCl_3$), aluminum fluoride ($AlF_3$), or the like. The etching byproducts $B_1$ may be large molecules, small molecules or polymers. In some embodiments, the etching byproducts B1 are volatile. The etching byproducts B1 may tend to be in a gaseous form.

The etching byproducts B1 may be able to evaporate away from the material layer 110. In some cases, the etching byproducts B1 may remain on the material layer 110 as a deposited thin film and impede the etching operation. In some cases, the etching byproducts B1 may remain on a sidewall W1 of the etching chamber 21. The etching byproducts B1 accumulating on the sidewall W1 may form a deposit, which may peel off and become contaminant particles when an amount of the deposit reaches a certain level. If the contaminant particles fall on the substrate 100, they may cause failure of the etching operation which could result in random yield loss and reduced productivity. Therefore, the etching byproducts B1 need to be promptly removed from the etching chamber 21. The pump system 23 may be used to desorb the etching byproducts B1 from the sidewall W1 or from the material layer 110 by continuously pumping.

Figure 4:
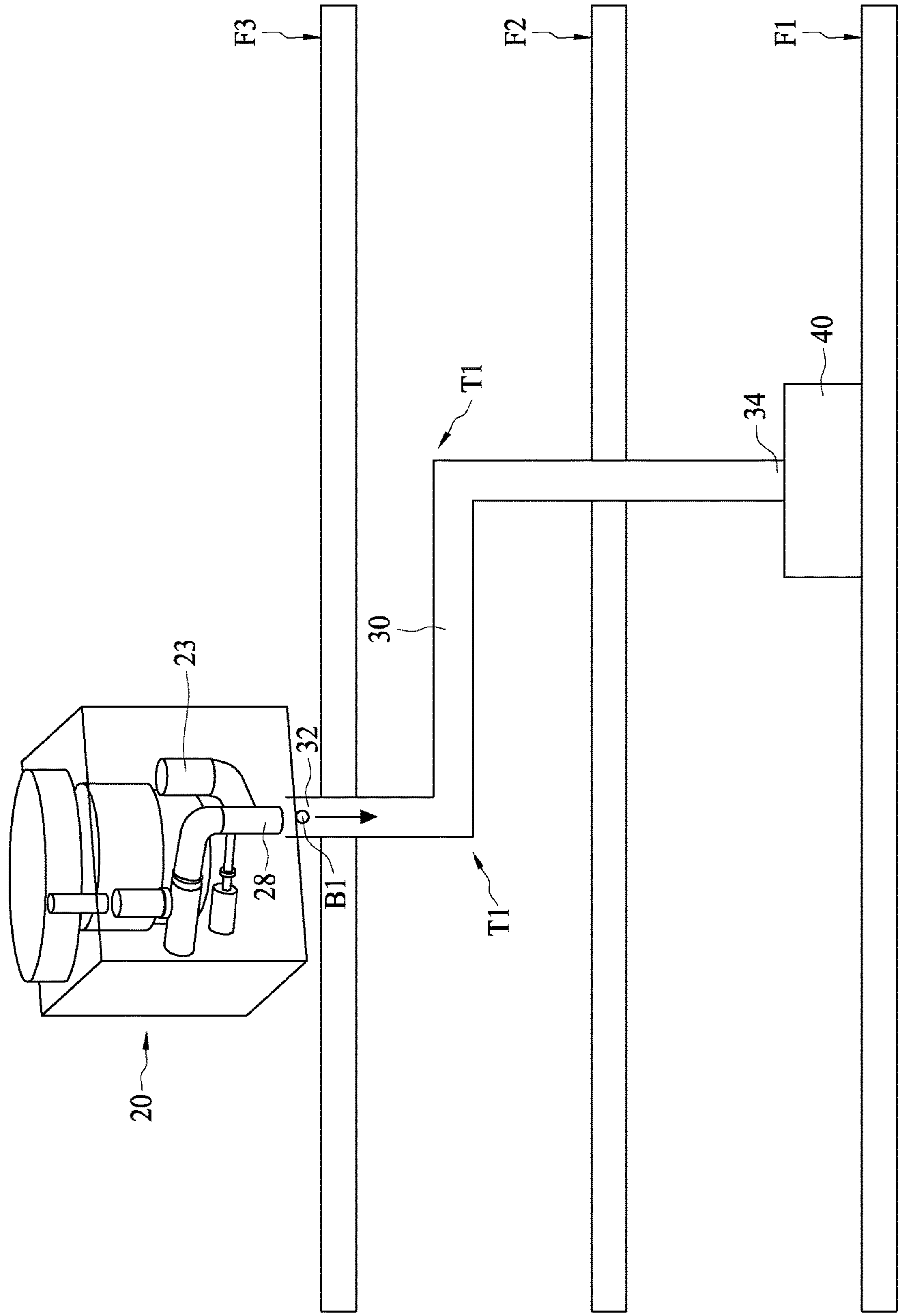
FIG. 4 (PRIOR ART)
FIG. 4 is a schematic view of a mechanism for discharging etching byproducts from an etching tool, in accordance with some embodiments of the present disclosure.

FIG. 4 is a schematic view of a mechanism for discharging the etching byproducts B1 from the etching tool 20. The etching byproducts B1 are discharged by the etching tool 20 in a form of exhaust gases. In some embodiments, the etching tool 20 includes an outlet 28 for discharging the etching byproducts B1. The outlet 28 may be connected to the pump system 23. A pipeline (discharge pipe) 30 may be connected to the etching tool 20. In some embodiments, the pipeline 30 includes a first end 32 connected to the outlet 28 of the etching tool 20 and a second end 34 connected to a pump 40. The pump 40 is configured to suck the etching byproducts B1 away from the etching tool 20. The etching byproducts B1 may flow through the pipeline 30 and toward the second end 34. In some embodiments, the etching tool 20 continuously discharges the etching byproducts B1 during operation of the etching tool 20. That is, the discharging of the etching byproducts B1 to the pipeline 30 and the etching of the material layer 110 may take place simultaneously.

In some embodiments, the pump 40 is placed or installed on a lower floor F1 such as a basement floor or a first floor of a fab. In some embodiments, the etching tool 20 is placed or installed on a higher floor F3 such as a second floor or a third floor of the fab. In some other embodiments, the pump 40 is placed on a higher floor and the etching tool 20 is placed on a lower floor of the fab. Since the etching tool 20 and the pump 40 are located on different floors, the pipeline 30 may extend, for example, through a middle floor F2 to connect the etching tool 20 and the pump 40. As a result, the first end 32 and the second end 34 may be distal to each other, and the second end 34 may be far away from the etching tool 20.

Figure 5:
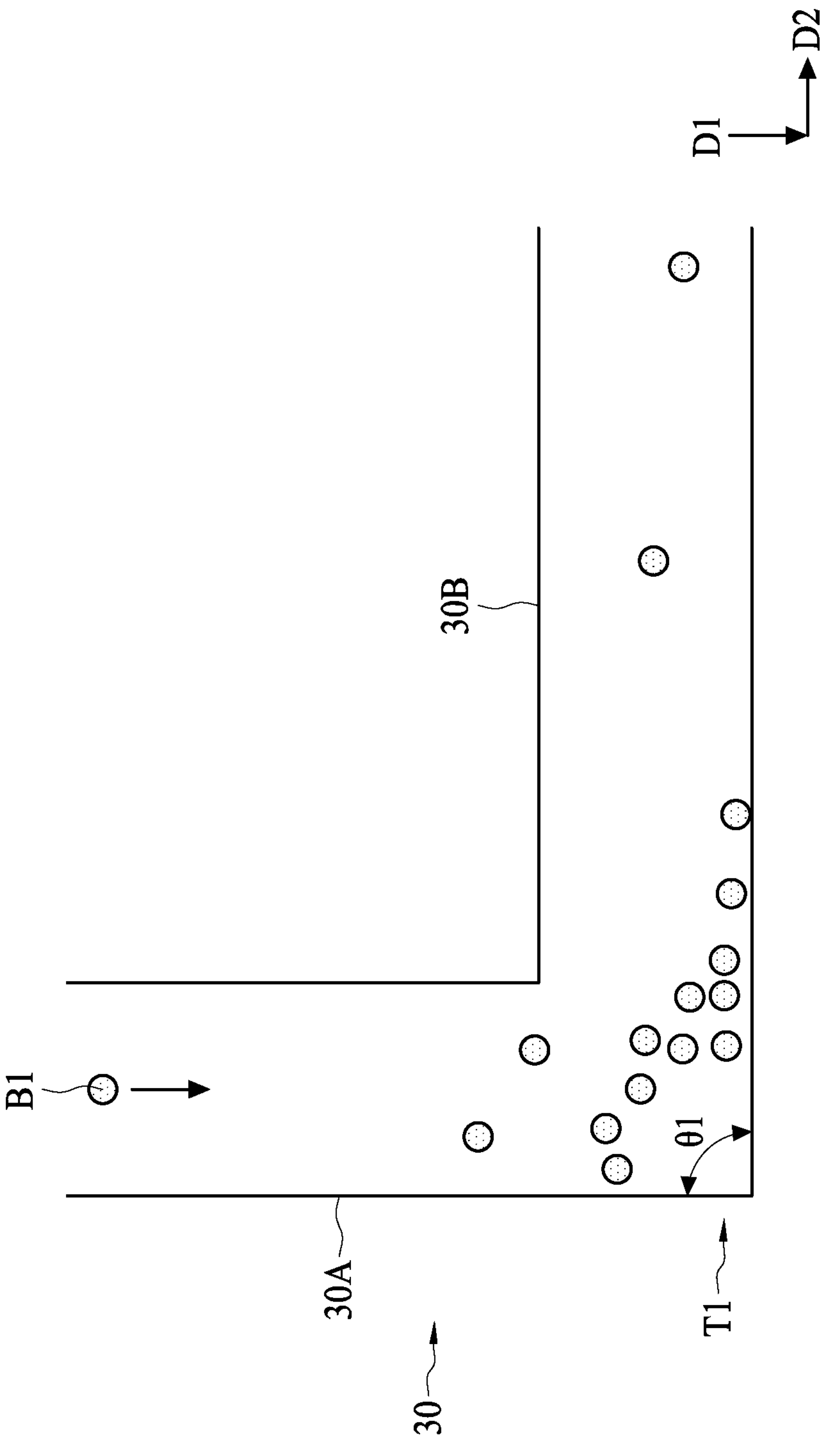
FIG. 5 ( PRIOR ART )
FIG. 5 is an enlarged view showing the etching byproducts flowing through a pipeline, in accordance with some embodiments of the present disclosure.

FIG. 5 is an enlarged view showing the etching byproducts B1 flowing through the pipeline 30. Referring to FIGS. 4 and 5, in some embodiments, the pipeline 30 includes a turning point T1 configured to change a flowing direction of the etching byproducts B1 inside the pipeline 30. The turning point T1 may be disposed at the middle floor F2, but the disclosure is not limited thereto. The pipeline 30 may include a vertical portion 30A and a horizontal portion 30B connected by the turning point T1. The vertical portion 30A extends along a first direction D1 and the horizontal portion 30B extends along a second direction D2 different from the first direction D1. An angle θ1 may be between the first direction D1 and the second direction D2. The angle θ1 may be an acute angle, a right angle or an obtuse angle, but not 180°. In some embodiments, the turning point T1 is used to change the flowing direction of the etching byproducts B1 from the first direction D1 to the second direction D2. Therefore, the etching byproducts B1 sucked by the pump 40 may flow from the first direction D1 to the second direction D2. In some cases, the etching byproducts B1 tend to accumulate at the turning point T1, as shown in FIG. 5. In some embodiments, the pipeline 30 includes multiple turning points T1. These turning points T1 may be disposed on the same floor or on different floors.

Figure 6:
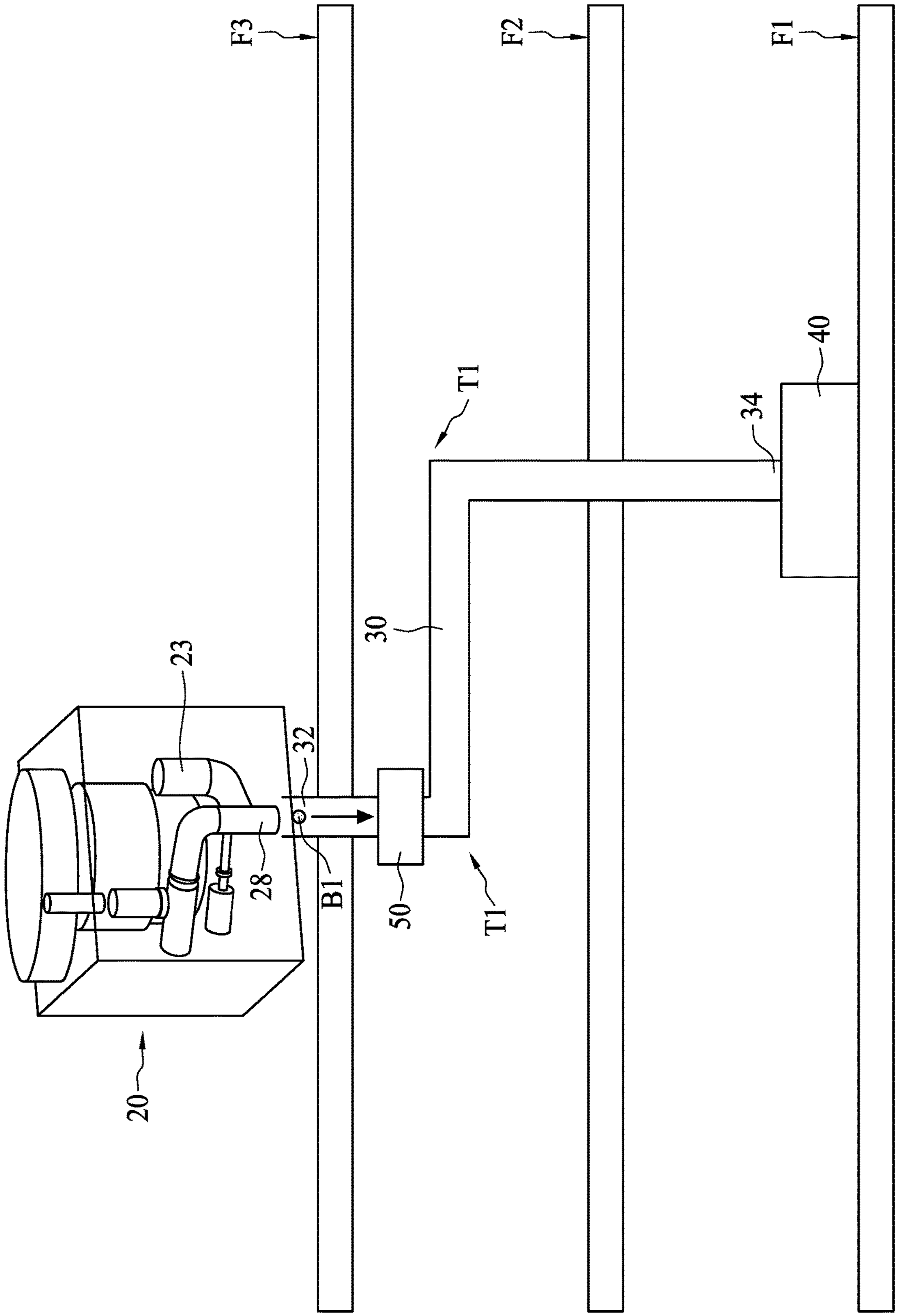
FIG. 6 is a schematic view of a mechanism for filtering the etching byproducts discharged by the etching tool, in accordance with some embodiments of the present disclosure.

Referring to FIG. 6, in some embodiments, a filter 50 is disposed between the first end 32 and the second end 34 of the pipeline 30. The filter 50 may be disposed proximal to the outlet 28 of the etching tool 20. In some embodiments, the filter 50 is disposed proximal to the outlet 28 of the etching tool 20. The filter 50 may be disposed in front of the turning point T1. In some embodiments, the filter 50 is disposed between the etching tool 20 and the turning point T1. The filter 50 can be installed in or detached from the pipeline 30 at any time according to actual requirements. The filter 50 is configured to filter the etching byproducts B1. The etching byproducts B1 are drawn by a fan (not shown) in the filter 50. Before the etching byproducts B1 reach the turning point T1, most of the etching byproducts may be trapped by the filter 50. Therefore, an amount of the etching byproducts B1 accumulating at the turning point T1 can be minimized. In some embodiments, when the filter 50 is used, the etching byproducts B1 are absent at the turning point T1.

In some embodiments, if the pipeline 30 includes multiple turning points T1, multiple filters 50 are disposed between the first end 32 and the second end 34. In such embodiments, one filter 50 is disposed in front of one turning point T1.

In some embodiments, the filter 50 is replaceable or washable. When a certain amount of the etching byproducts B1 are accumulated in the filter 50, the filter 50 can be removed from the pipeline 30. The filter 50 may be cleaned and reinstalled in the pipeline 30 or directly replaced by a brand-new filter. Therefore, the filter 50 can prevent the accumulation of the etching byproducts B1 in the pipeline 30.

Figure 7:
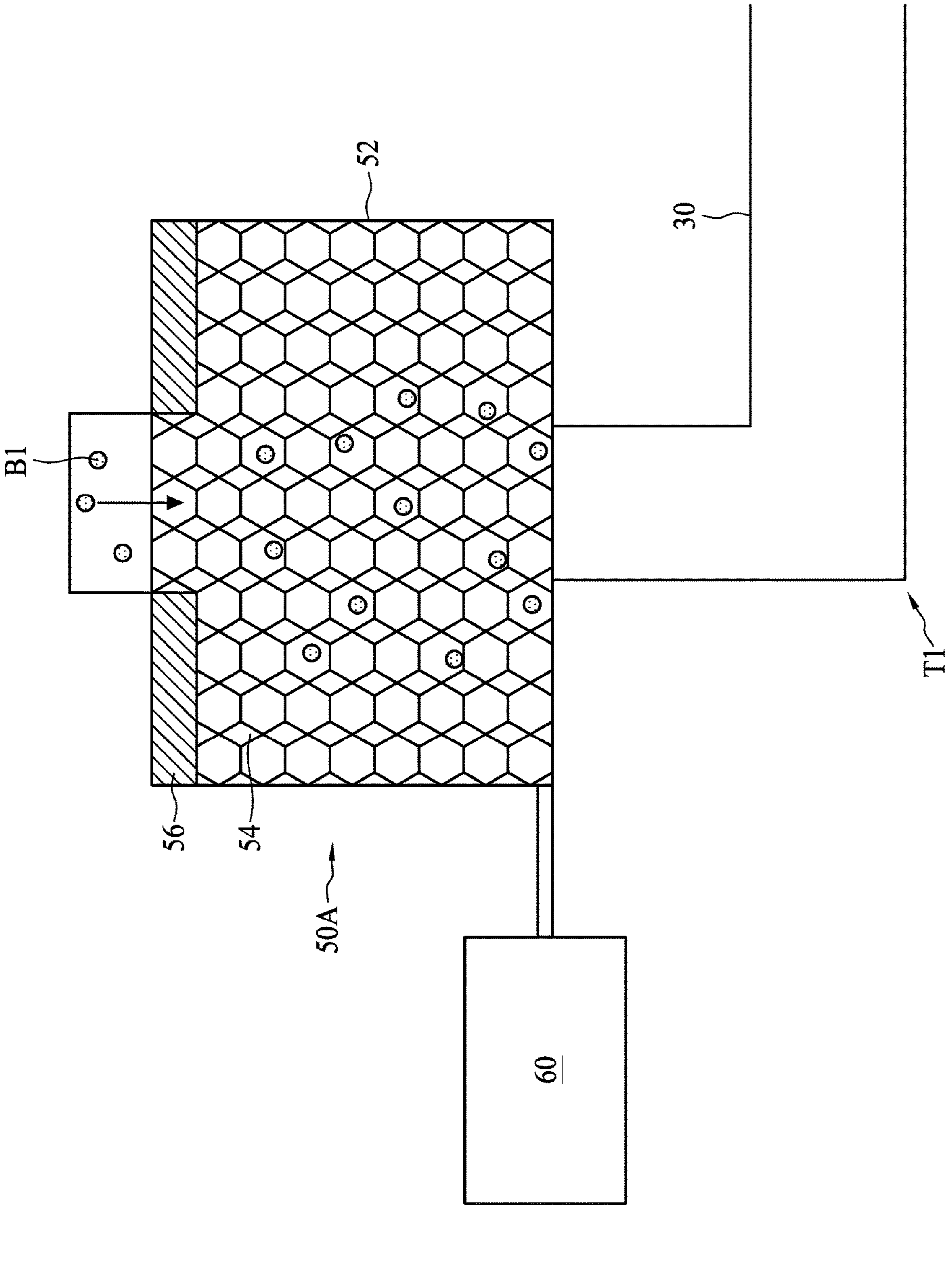
FIGS. 7 and 8 are enlarged views of a filter in FIG. 6 for trapping the etching byproducts, in accordance with some embodiments of the present disclosure.
Figure 8:
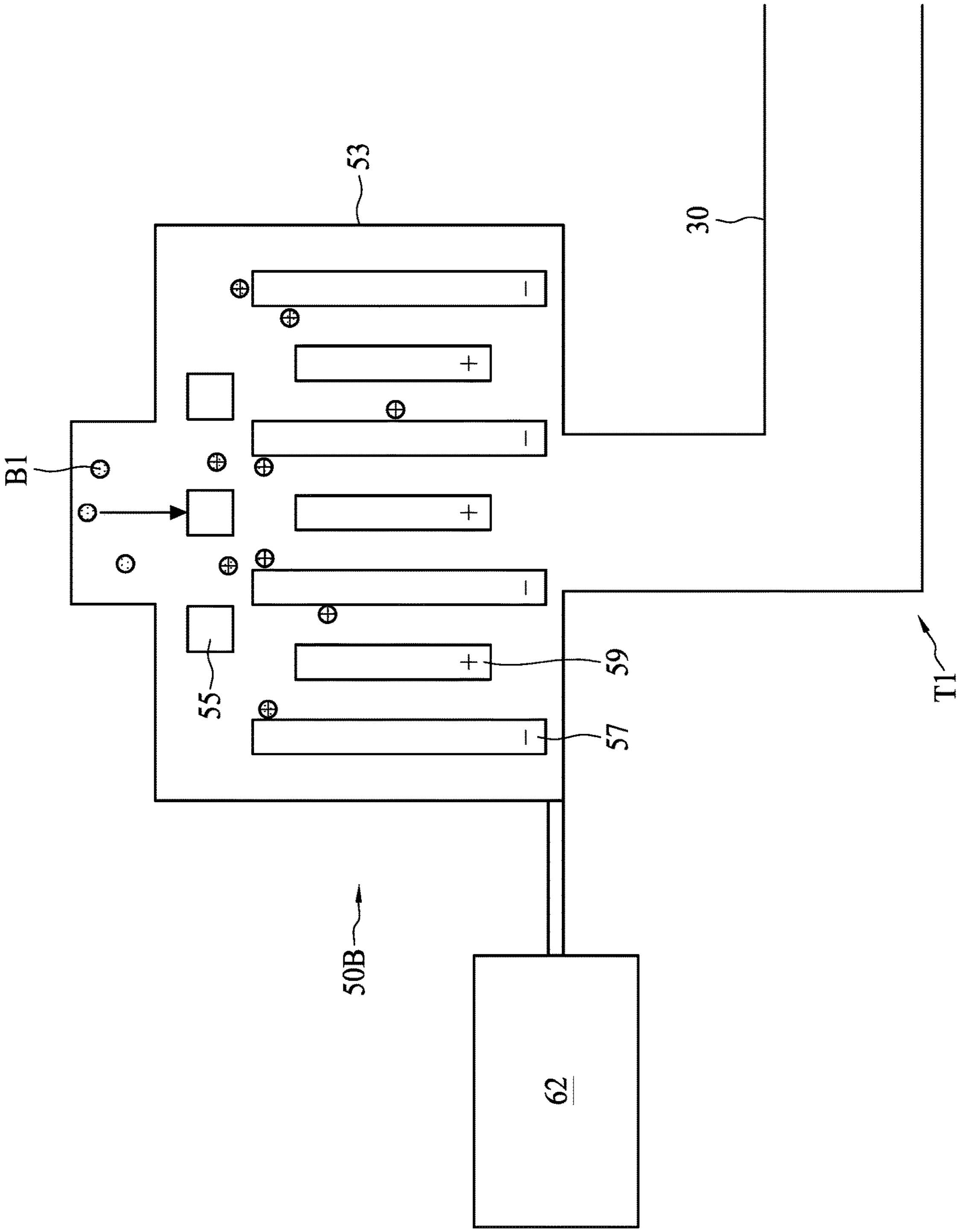

FIGS. 7 and 8 are enlarged views of the filter 50. The filter 50 can trap the etching byproducts B1 according to different mechanisms. Referring to FIG. 7, in some embodiments, the filter 50 is an adsorption-type filter 50A. The etching byproducts B1 may be trapped using an adsorptive interaction. In some embodiments, the filter 50A includes a housing 52, a filter medium 54 and a solidifier 56. In some embodiments, the housing 52 is for accommodating the trapped etching byproducts B1. In some embodiments, the filter medium 54 includes synthetic fibers, natural fibers, porous materials, or the like. The filter medium 54 may be made of sponges, nylon, activated carbon, molecular sieve, polyester, polyurethane, yttrium (III) oxide ($Y_2O_3$), or other suitable materials. In some embodiments, the filter medium 54 has a mesh or nest structure. The filter medium 54 may have a large surface area. In some other embodiments, the filter medium 54 is designed to include multiple holes or fine hair structures to increase the surface area, which can absorb a large number of etching byproducts B1.

In some embodiments, the solidifier 56 is disposed at an entry of the filter 50A. The solidifier 56 may be a temperature controller of the filter 50A such as a heater or a freezer. In some embodiments, the temperature in the housing 52 is adjustable to be in a range between −30° C. and 200° C. by the solidifier 56. The etching byproducts B1 in the gaseous state may not be easily trapped. Therefore, in some embodiments, the solidifier 56 in the filter 50A is used to solidify the etching byproducts B1 by freezing or heating. The gaseous etching byproducts B1 can be solidified shortly after they enter the housing 52 of the filter 50A. The solidified etching byproducts B1 do not easily pass through the filter medium 54, and are thus adsorbed by the filter medium 54. As a result, in some embodiments, the solidified etching byproducts B1 fail to pass through the filter 50A. That is, few or substantially no etching byproducts B1 can reach the turning point T1 of the pipeline 30. An issue of the etching byproducts B1 tending to accumulate at the turning point T1 can be solved with the use of the filter 50A. In some embodiments, the filter medium 54 is detachable from the filter 50A. The adsorbed etching by products B1 may be washed away from the filter medium 54. In some embodiments, the filter medium 54 is can be replaced by a new filter medium.

Still referring to FIG. 7, in some embodiments, a spectrometer 60 is electrically coupled to the filter 50A. The spectrometer 60 is configured to detect the amount of the etching byproducts B1 retained in the filter 50A. In some embodiments, the spectrometer 60 is a spectrometer of UV-visible absorption spectroscopy, photoluminescence (PL) spectroscopy, electroluminescence (EL) spectroscopy, or the like. The spectrometer 60 may be used to detect a change of spectral signals to determine the amount of the etching byproducts B1 trapped by the filter medium 54. As the amount of the etching byproducts B1 accumulated in the filter medium 54 gradually increases, optical properties such as wavelength and intensity over a specific portion of the electromagnetic range may vary over time. For example, when a certain amount of the etching byproducts B1 is reached, additional peaks may appear in the spectrum. Therefore, such information may be used to detect the amount of the etching byproducts B1 retained in the filter medium 54, and a timing to replace or wash the filter medium 54 of the filter 50A can be determined.

Referring to FIG. 8, in some embodiments, the filter 50 is an electrostatic filter 50B. The etching byproducts B1 may be trapped using electrostatic adsorption. In some embodiments, the filter 50B includes a housing 53, an ionizer 55, and multiple metal plates 57 and 59. In some embodiments, the housing 53 is for accommodating the trapped etching byproducts B1. In some embodiments, the ionizer 55 is used to ionize the gaseous etching byproducts B1. In some embodiments, a high voltage is applied to the metal plates 57 and 59 to cause the metal plates 57 and 59 to be charged. In some embodiments, the metal plates 57 are electrodes having a negative polarity, and the metal plates 59 are electrodes having a positive polarity. The metal plates 57 and the metal plates 59 may be alternately arranged and parallel to each other. The etching byproducts B1 before entering the filter 50B may be neutral gaseous molecules. Therefore, in some embodiments, when the filter 50B is used, it is necessary to cause the neutral etching byproducts B1 to carry charges.

After passing the ionizer 55, the etching byproducts B1 are ionized. The ionized etching byproducts B1 may be cations, anions or free radicals. In some embodiments, the ionized etching byproducts B1 are positively charged. In such embodiments, the positively charged etching byproducts B1 are attracted to the negatively polarized metal plates 57 by electrostatic attraction. In some other embodiments, the ionized etching byproducts B1 are negatively charged. In such embodiments, the negatively charged etching byproducts B1 are attracted to the positively polarized metal plates 59 by electrostatic attraction. The metal plates 57, 59 may be referred to as ion collectors. As a result, in some embodiments, the attracted etching byproducts B1 fail to pass through the filter 50B. That is, substantially no etching byproducts B1 can reach the turning point T1 of the pipeline 30. The issue of the etching byproducts B1 tending to accumulate at the turning point T1 can be mitigated with the use of the filter 50B.

Still referring to FIG. 8, in some embodiments, a spectrometer 62 is electrically coupled to the filter 50B. The spectrometer 62 is configured to detect an amount of the etching byproducts B1 retained in the filter 50B. In some embodiments, the spectrometer 60 is a spectrometer of UV-visible absorption spectroscopy, PL spectroscopy, EL spectroscopy or the like. The spectrometer 62 may be used to detect a change of spectral signals to determine the amount of the etching byproducts B1 trapped by the filter 50B. As the amount of the etching byproducts B1 accumulated in the filter 50B gradually increases, optical properties such as wavelength and intensity over a specific portion of the electromagnetic range may vary over time. For example, when a certain amount of the etching byproducts B1 is reached, additional peaks may appear in the spectrum. Therefore, such information may be used to detect the amount of the etching byproducts B1 retained in the filter 50B, and a timing to replace or wash the filter 50B can be determined.

Figure 9:
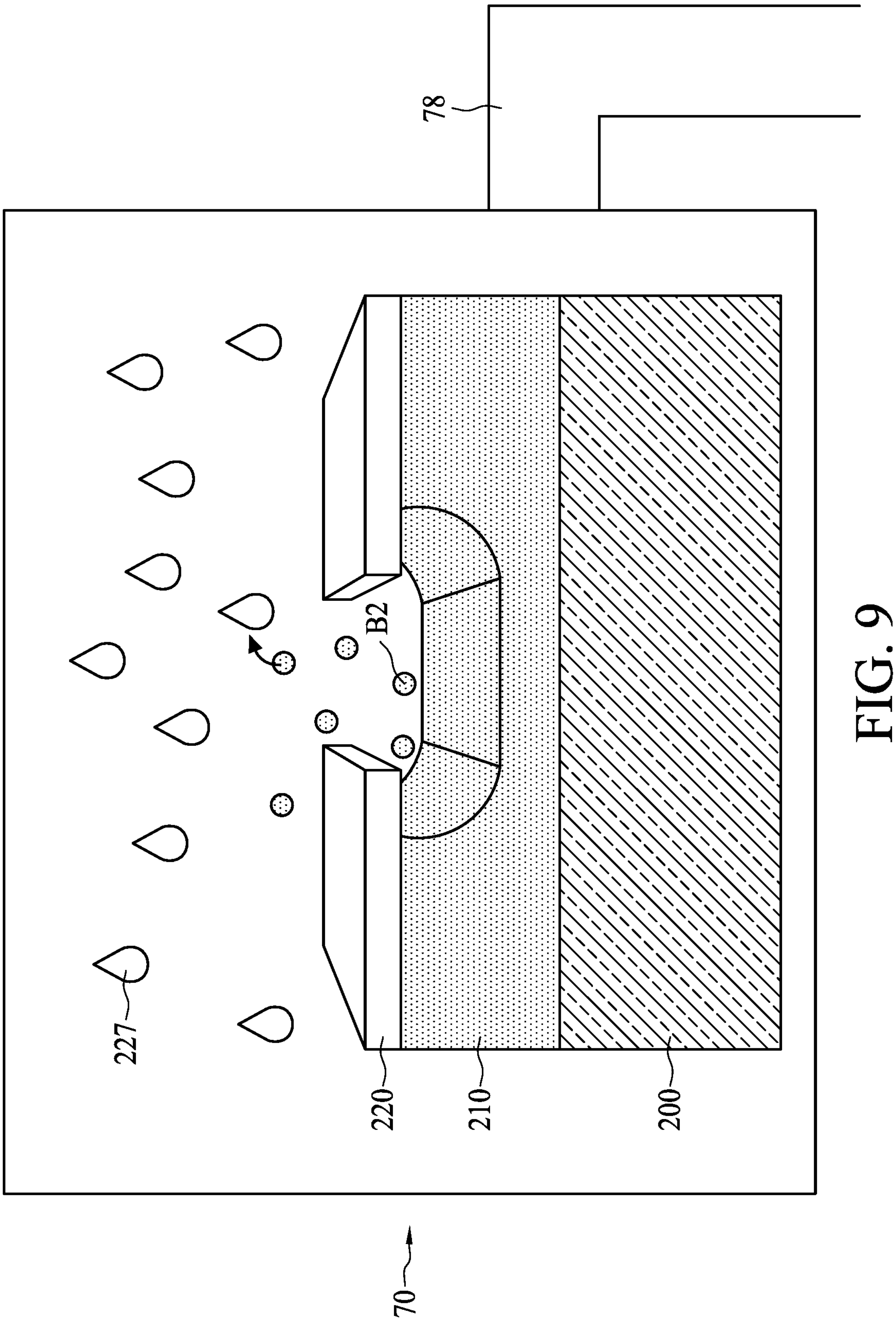
FIG. 9 is a schematic view of microscopic processes that occur during wet etching, in accordance with some embodiments of the present disclosure.

FIG. 9 is a schematic view of microscopic processes that occur during wet etching. An etching tool 70, which is a type of wet etching equipment, may be provided. Wet etching, also referred to as chemical etching, is a process of removing portions of a semiconductor material using a liquid reactant. A selectivity of a wet etching operation is high because chemicals used can be adapted very precisely to individual films. For most liquid reactants, the selectivity is greater than 100:1.

Referring to FIG. 9, a substrate 200 with a material layer 210 formed thereon is placed in the etching tool 70. The substrate 200 may be a wafer, and the material layer 210 may include a dielectric layer, a metallic layer, a semiconductor layer, a ceramic layer, a glass layer or the like. A mask layer 220 may be formed on the material layer 210. The mask layer 220 may be a photoresist layer or a hard mask layer which has been patterned using a photolithographic method. Therefore, the mask layer 220 may include a predetermined pattern such as strips or holes that expose portions of the material layer 210. An etchant 227 may be applied to exposed portions of the material layer 210. In some embodiments, the etchant 227 is a chemical mixture that dissolves the material layer 210 or an oxide of the material layer 210. In some embodiments, the etchant 227 is in a gaseous or liquid state. In some embodiments, if the material layer 210 is made of a crystalline material, the etchant 227 etches the crystalline material at different rates according to which crystal face is exposed to the etchant 227. In some embodiments, the etchant 227 includes an acid such as hydrofluoric acid (HF), hydrochloric acid (HCl), citric acid, or the like. In some embodiments, the etchant 227 includes a base such as potassium hydroxide (KOH), ethylenediamine pyrocatechol (EDP), tetramethylammonium hydroxide (TMAH), or the like.

After the etchant 227 reacts with the exposed portion of the material layer 210, portions of the material layer 210 may be stripped to form etching byproducts B2. In some embodiments, the etching byproducts B2 are soluble in the etchant 227. In some other embodiments, the etching byproducts B2 are not soluble in the etchant 227. During the wet etching operation, the soluble and insoluble components (i.e., precipitates) of the etching byproducts B2 are carried by the etchant 227 and discharged out of the etching tool 70. In some embodiments, the etching tool 70 includes an outlet 78 for discharging the etching byproducts B2.

Figure 10:
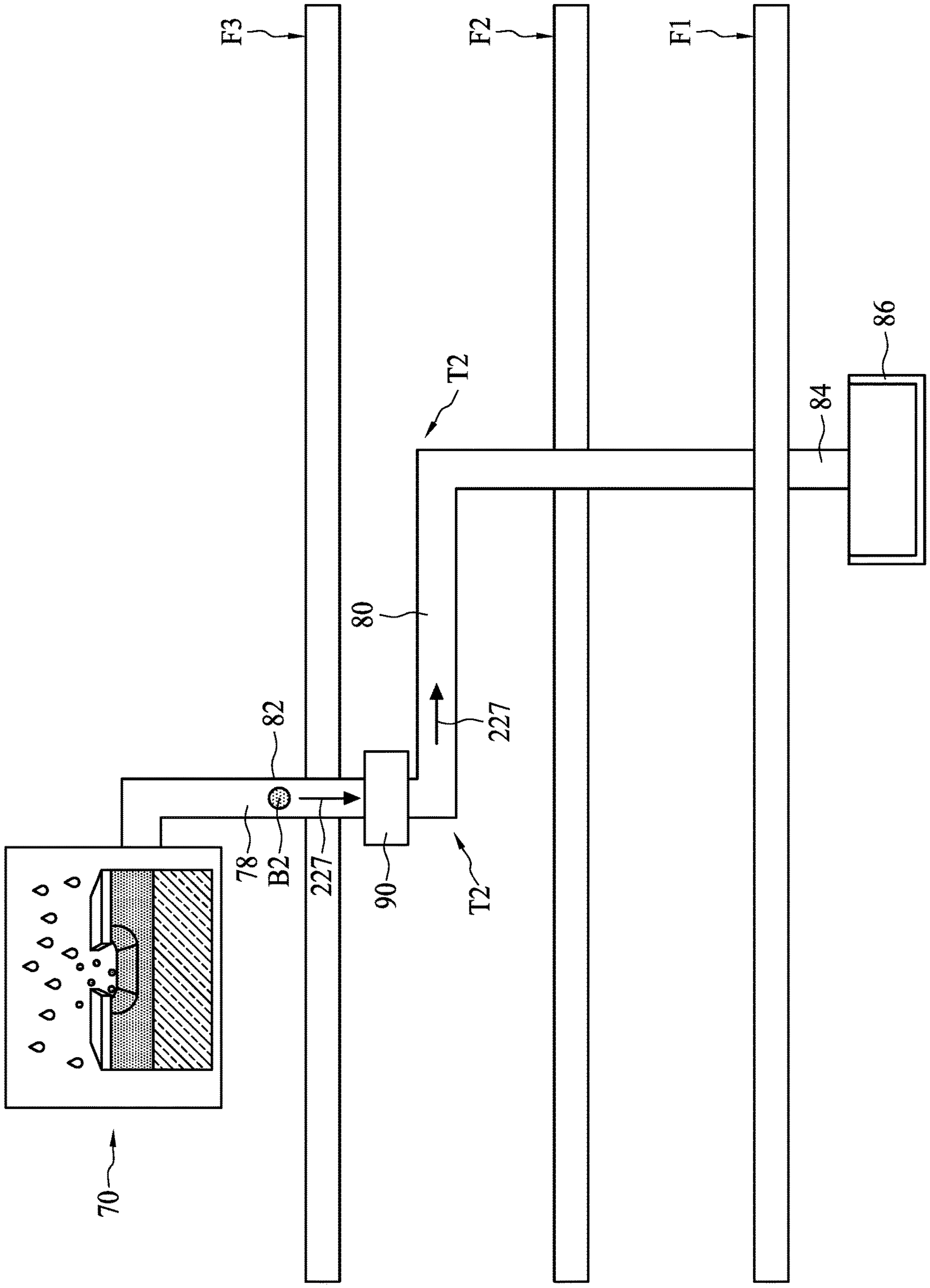
FIG. 10 is a schematic view of a mechanism for filtering etching byproducts discharged by another etching tool, in accordance with some embodiments of the present disclosure.

FIG. 10 is a schematic view of a mechanism for filtering etching byproducts B2 discharged by the etching tool 70. The etching byproducts B2 are exhaust liquid mixtures from the etching tool 70. A pipeline 80 may be connected to the etching tool 70. In some embodiments, the pipeline 80 includes a first end 82 connected to the outlet 78 of the etching tool 70 and a second end 84 connected to a waste tank 86. The etching byproducts B2 may flow through the pipeline 80 and toward the second end 84. In some embodiments, the etching tool 70 continuously discharges the etching byproducts B2 during operation of the etching tool 70. That is, the discharging of the etching byproducts B2 to the pipeline 80 and the etching of the material layer 210 may take place simultaneously.

In some embodiments, the waste tank 86 is placed or installed on a lower floor F1 such as a basement floor or a first floor of a fab. In some embodiments, the etching tool 70 is placed or installed on a higher floor F3 such as a second floor or a third floor of the fab. Since the etching tool 70 and the waste tank 86 are located on different floors, the pipeline 80 may extend, for example, through a middle floor F2, to connect the etching tool 70 and the waste tank 86. As a result, the first end 82 and the second end 84 may be distal to each other, and the second end 84 may be far away from the etching tool 70. In some embodiments, the pipeline 80 includes a turning point T2 configured to change a flowing direction of the etching byproducts B2 inside the pipeline 80. The turning point T2 may be disposed on the middle floor F2, but the disclosure is not limited thereto.

Still referring to FIG. 10, in some embodiments, a filter 90 is disposed between the first end 82 and the second end 84 of the pipeline 80. The filter 90 may be disposed proximal to the outlet 78 of the etching tool 70. In some embodiments, the filter 90 is disposed proximal to the outlet 78 of the etching tool 70. The filter 90 may be disposed in front of the turning point T2. In some embodiments, the filter 90 is disposed between the etching tool 70 and the turning point T2. The filter 90 can be installed in or detached from the pipeline 80 at any time according to actual requirements. In some embodiments, the filter 90 is used to filter precipitates of the etching byproducts B2. Components of the etching byproducts B2 dissolved in the etchant 227 may pass through the filter 90. Before the precipitates reach the turning point T2, they may be trapped by the filter 90.

Therefore, the precipitates of the etching byproducts B2 will not accumulate at the turning point T2.

In some embodiments, if the pipeline 80 includes multiple turning points T2, multiple filters 90 are disposed between the first end 82 and the second end 84. In such embodiments, one filter 90 is disposed in front of one turning point T2.

In some embodiments, the filter 90 is replaceable or washable. When a certain amount of precipitates of the etching byproducts B2 are accumulated in the filter 90, the filter 90 can be removed from the pipeline 80. The filter 90 may be cleaned and reinstalled in the pipeline 80 or directly replaced by a brand-new filter.

In a conventional etching system, etching byproducts tend to accumulate at turning points of a discharge pipe connected to an etching tool. To remove the accumulated etching byproducts, the entire discharge pipe needs to be disassembled and cleaned, which is a large task and very inconvenient. The present disclosure provides a method to solve such problem. A filter is disposed proximal to an outlet of an etching tool and in front of a turning point. That is, the filter is disposed between the etching tool and the turning point. With the use of the filter, etching byproducts will not accumulate at turning points of a discharge pipe. The filter can be cleaned and reinstalled in the discharge pipe. Therefore, it is not necessary to disassemble the discharge pipe to remove the accumulated etching byproducts.

Figure 11:
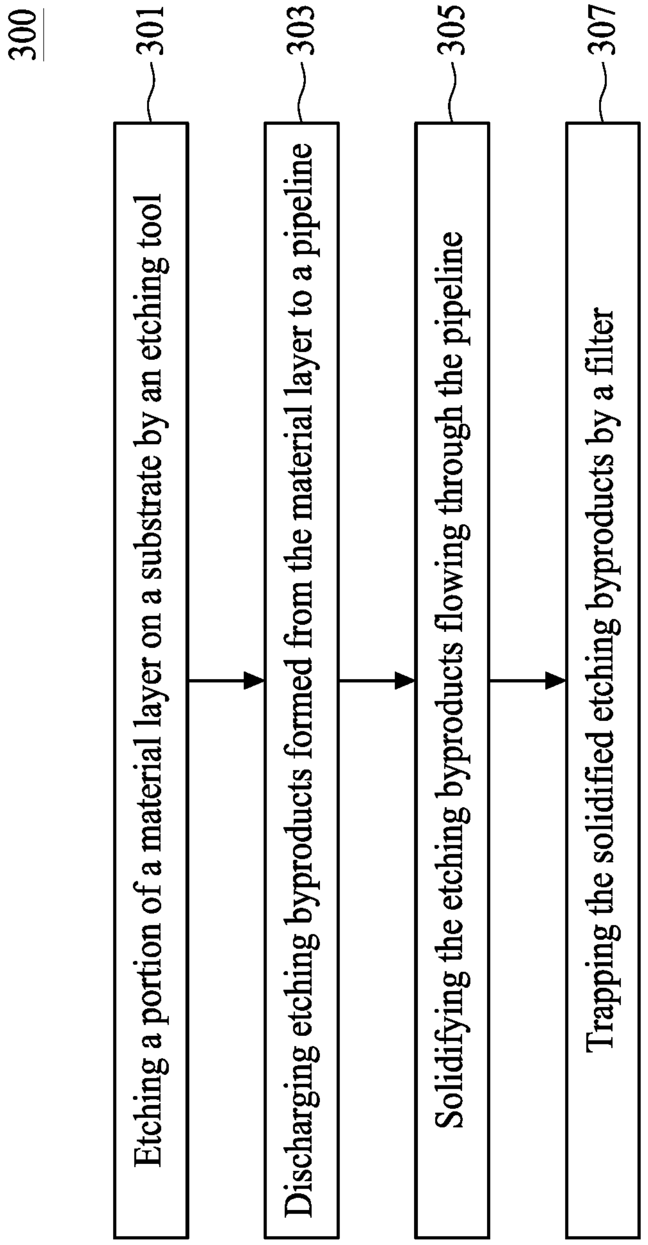
FIG. 11 is a flow diagram showing a method for filtering an etching byproduct during semiconductor fabrication, in accordance with some embodiments of the present disclosure.

The present disclosure also provides a method 300 for filtering an etching byproduct during semiconductor fabrication. FIG. 11 is a flow diagram showing the method 300. The method 300 includes several operations (301, 303, 305 and 307) and the description and illustration are not deemed as a limitation to the sequence of the operations.

In operation 301 of FIG. 11, a portion of a material layer 110 on a substrate 100 is etched by an etching tool 20, as shown in FIG. 3.

In operation 303 of FIG. 11, etching byproducts B1 formed from the material layer 110 are discharged to a pipeline 30, as shown in FIG. 4. In some embodiments, the etching byproducts B1 are formed during a reaction between the portion of the material layer 110 and a plasma. The etched portion of the material layer 110 may be sucked away from an unreacted portion of the material layer 110. The etching byproducts B1 discharged from the etching tool 20 may flow through the pipeline 30.

In operation 305 of FIG. 11, the etching byproducts B1 flowing through the pipeline 30 are solidified, as shown in FIG. 7. In some embodiments, the etching byproducts B1 are volatile and tend to be in a gaseous form. The etching byproducts B1 in the gaseous form may not be easily trapped. Therefore, in some embodiments, a solidifier 56 is used to solidify the etching byproducts B1 by freezing or heating. In some other embodiments, if the etching byproducts B1 are charged or are neutral but can be easily ionized to carry charges, the etching byproducts B1 may not need to be solidified.

In operation 307 of FIG. 11, the solidified etching byproducts B1 are trapped by an adsorption-type filter 50A, as shown in FIG. 7. The filter 50A can trap the solidified etching byproducts B1 because the solidified etching byproducts B1 do not easily pass through a filter medium 54 of the filter 50A. In some embodiments, the filter medium 54 is made of sponge, nylon, activated carbon, molecular sieve, polyester, polyurethane, yttrium (III) oxide ($Y_2O_3$), or other suitable materials. In some embodiments, the filter medium 54 has a mesh or nest structure which has a large surface area. In some other embodiments, the filter medium 54 is designed to include multiple holes or fine hair structures to increase the surface area, which can absorb a large number of the solidified etching byproducts B1. In some embodiments, the filter medium 54 is detachable from the filter 50A. The adsorbed etching byproducts B1 may be washed away from the filter medium 54. In some embodiments, the filter medium 54 can be replaced by a new filter medium.

In some embodiments, if the etching byproducts B1 are charged, an electrostatic filter 50B can be used. The etching byproducts B1 may be trapped using electrostatic adsorption, as shown in FIG. 8. In some embodiments, the filter 50B includes multiple metal plates 57 and 59. The metal plates 57 and the metal plates 59 may be alternately arranged and parallel to each other. A high voltage may be applied to the metal plates 57 and 59 to cause the metal plates 57 and 59 to be charged. In some embodiments, the metal plates 57 are electrodes having a negative polarity, and the metal plates 59 are electrodes having a positive polarity. When the etching byproducts B1 approach the metal plates 57 and 59, the etching byproducts B1 may be attracted to the negatively polarized metal plates 57 or the positively polarized metal plates 59. In some embodiments, if the etching byproducts B1 are positively charged, the positively charged etching byproducts B1 will be attracted to the negatively polarized metal plates 57 by electrostatic attraction. In some other embodiments, if the etching byproducts B1 are negatively charged, the negatively charged etching byproducts B1 will be attracted to the positively polarized metal plates 59 by electrostatic attraction. Therefore, the attracted etching byproducts B1 are retained in the filter 50B and fail to pass through the filter 50B.

Referring to FIG. 7 or 8, in some embodiments, a spectrometer 60 is electrically coupled to the filter 50A. The spectrometer 60 is configured to detect an amount of the etching byproducts B1 retained in the filter 50A. The spectrometer 60 may be used to detect a change of spectral signals to determine the amount of the etching byproducts B1 trapped by the filter medium 54. As the amount of the etching byproducts B1 accumulated in the filter medium 54 gradually increases, optical properties such as wavelength and intensity over a specific portion of the electromagnetic range may vary over time. For example, when a certain amount of the etching byproducts B1 is reached, additional peaks may appear in the spectrum. Therefore, such information may be used to detect the amount of the etching byproducts B1 retained in the filter medium 54, and a timing to replace or wash the filter medium 54 of the filter 50A can be determined.

One aspect of the present disclosure provides a mechanism for filtering an etching byproduct during semiconductor fabrication. The mechanism includes: an etching tool, configured to etch a portion of a material layer and having an outlet for discharging the etching byproduct formed from the etched portion of the material layer; a pipeline, for allowing the etching byproduct to flow through, the pipeline having a first end connected to the outlet of the etching tool and a second end distal to the first end and the etching tool; and a filter, disposed between the first end and the second end and configured to filter the etching byproduct. The filter includes a solidifier configured to solidify the etching byproduct by freezing or heating, and a medium configured to retain the etching byproduct solidified by the solidifier.

One aspect of the present disclosure provides another mechanism for filtering an etching byproduct during semiconductor fabrication. The mechanism includes: an etching tool, having an outlet for discharging the etching byproduct during an operation of the etching tool; a pipeline, having a first end connected to the outlet of the etching tool and a second end connected to a pump for sucking the etching byproduct through the pipeline and toward the second end; and a filter, disposed between the first end and the second end and proximal to the outlet of the etching tool. The filter includes a medium configured to retain the etching byproduct.

Another aspect of the present disclosure provides a method for filtering an etching byproduct during semiconductor fabrication. The method includes: etching a portion of a material layer on a substrate by an etching tool; discharging the etching byproduct formed from the etched portion of the material layer out of the etching tool to flow through a pipeline; solidifying the etching byproduct flowing through the pipeline; and trapping the solidified byproduct by a filter.

The foregoing outlines structures of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mechanism for filtering an etching byproduct during semiconductor fabrication, comprising:

an etching tool, configured to etch a portion of a material layer and having an outlet for discharging the etching byproduct formed from the etched portion of the material layer;

a pipeline, for allowing the etching byproduct to flow through, the pipeline having a first end connected to the outlet of the etching tool and a second end distal to the first end and the etching tool, wherein the pipeline further includes:

a first turning point close to the first end of the pipeline and configured to change a flowing direction of the etching byproduct inside the pipeline from a first flowing direction to a second flowing direction; and a second turning point configured to change the flowing direction of the etching byproduct inside the pipeline from the second flowing direction to a third flowing direction;

a first filter, disposed between the first end and the first turning point and configured to filter the etching byproduct, wherein the first filter includes a solidifier configured to solidify the etching byproduct by freezing or heating, and a medium configured to retain the etching byproduct solidified by the solidifier; and a second filter, disposed between the first turning point and the second point and configured to filter the etching byproduct.

2. The mechanism of claim 1, further comprising a pump, wherein the pump is configured to suck the etching byproduct out of the etching tool.

3. The mechanism of claim 1, wherein the pipeline extends between multiple floors.

4. The mechanism of claim 1, wherein the etching byproduct includes polymer.

5. The mechanism of claim 4, wherein the first filter and/or the second filter is an electrostatic filter, and the polymer is trapped in the first filter and/or the second filter by electrostatic attraction.

6. The mechanism of claim 1, wherein an acute angle is between the first flowing direction and the second flowing direction.

7. The mechanism of claim 6, wherein the etching byproduct accumulated at the turning point is minimized or absent.

8. The mechanism of claim 1, wherein the medium retains the etching byproduct solidified by the solidifier.

9. The mechanism of claim 1, further comprising a spectrometer electrically coupled to the first filter, or the second filter or both of the first filter and the second filter, wherein the spectrometer is configured to detect an amount of the etching byproduct adsorbed by the first filter and/or the second filter.

10. A mechanism for filtering an etching byproduct during semiconductor fabrication, comprising:

an etching tool, having an outlet for discharging the etching byproduct during an operation of the etching tool;

a pipeline having a first end connected to the outlet of the etching tool and a second end distal to the first end and the etching tool, wherein the pipeline further includes:

a first turning point close to the first end of the pipeline and configured to change a flowing direction of the etching byproduct inside the pipeline from a first flowing direction to a second flowing direction; and a second turning point configured to change the flowing direction of the etching byproduct inside the pipeline from the second flowing direction to a third flowing direction;

a first filter, disposed between the first end and the first turning point of the pipeline and proximal to the outlet of the etching tool, wherein the first filter includes a solidifier configured to solidify the etching byproduct by freezing or heating, and a medium configured to retain the etching byproduct solidified by the solidifier; and a second filter, disposed between the first turning point and the second point.

11. The mechanism of claim 10, wherein the first filter is attachable to or detachable from the pipeline, and the second filter is attachable to or detachable from the pipeline.

12. The mechanism of claim 10, wherein the first filter is replaceable or washable, and the second filter is replaceable or washable.

13. The mechanism of claim 10, further comprising a spectrometer electrically coupled to the first filter, or the second filter or both of the first filter and the second filter, and configured to detect a light signal to determine a timing to replace or wash the first filter and/or the second filter.

14. The mechanism of claim 10, wherein the medium includes polyurethane, activated carbon, or yttrium (III) oxide ($Y_2O_3$).

15. The mechanism of claim 10, wherein the medium retains the etching byproduct solidified by the solidifier.

16. The mechanism of claim 10, further comprising a pump, wherein the pump is configured to suck the etching byproduct out of the etching tool.

17. A mechanism for filtering an etching byproduct during semiconductor fabrication, comprising:

an etching tool having an outlet for discharging the etching byproduct;

a pipeline connected to the etching tool including:

a first turning point close to the etching tool and configured to change a flowing direction of the etching byproduct inside the pipeline from a first flowing direction to a second flowing direction; and a second turning point configured to change the flowing direction of the etching byproduct inside the pipeline from the second flowing direction to a third flowing direction;

a first filter installed between the outlet of the etching tool and the first turning point in the pipeline, wherein the first filter includes a solidifier configured to solidify the etching byproduct by freezing or heating, and a medium configured to retain the etching byproduct solidified by the solidifier; and a second filter installed between the first turning point and the second point, wherein the second filter includes a solidifier configured to solidify the etching byproduct by freezing or heating, and a medium configured to retain the etching byproduct solidified by the solidifier.

18. The mechanism of claim 17, wherein the first filter is attachable to or detachable from the pipeline, and the second filter is attachable to or detachable from the pipeline.

19. The mechanism of claim 17, wherein the etching byproduct carries charges, the first filter and/or the second filter is an electrostatic filter, and the etching byproduct is trapped in the first filter and/or the second filter by electrostatic attraction.

20. The mechanism of claim 17, wherein the medium in the first filter, or the second filter or both of the first filter and the second filter includes multiple holes and/or fine hair structures.

* * * * *